(12) United States Patent
He et al.

(10) Patent No.: US 7,452,776 B1
(45) Date of Patent: Nov. 18, 2008

(54) INTEGRATED CIRCUITS WITH SUBSTRATE PROTRUSIONS, INCLUDING (BUT NOT LIMITED TO) FLOATING GATE MEMORIES

(75) Inventors: Yue-Song He, San Jose, CA (US); Len Mei, San Jose, CA (US)

(73) Assignee: ProMOS Technoloies Pte. Ltd., Singapore (SG)

( * ) Notice: Subject to any disclaimer, the term of this patent is extended or adjusted under 35 U.S.C. 154(b) by 0 days.

(21) Appl. No.: 11/739,482

(22) Filed: Apr. 24, 2007

(51) Int. Cl.
*H01L 21/8247* (2006.01)

(52) U.S. Cl. ............................... 438/259; 257/E21.179

(58) Field of Classification Search ......... 438/257–267; 257/E21.179
See application file for complete search history.

(56) References Cited

U.S. PATENT DOCUMENTS

| | | | |
|---|---|---|---|
| 5,654,217 A * | 8/1997 | Yuan et al. ................... | 438/588 |
| 6,262,926 B1 | 7/2001 | Nakai | |
| 6,714,447 B2 | 3/2004 | Satoh et al. | |
| 2007/0018218 A1 | 1/2007 | Kretz et al. | |

OTHER PUBLICATIONS

Jeong-Dong Choe et al. "Low Voltage Program/Erase Characteristics of Si Nanocrystal Memory with Damascene Gate FinFET on Bulk Si Wafer," Journal of Semiconductor Technology and Science, vol. 6, No. 2, Jun. 2006, pp. 68-73.

Laura Peters "Double Gates Prompt Transistor Revolution," Reed Business Information, a division of Reed Elsevier Inc. Semiconductor International, Mar. 1, 2005, pp. 1-6.

* cited by examiner

*Primary Examiner*—Richard A. Booth
(74) *Attorney, Agent, or Firm*—Michael Shenker; MacPherson Kwok Chen & Heid LLP

(57) ABSTRACT

A floating gate memory cell's channel region (104) is at least partially located in a fin-like protrusion (110P) of a semiconductor substrate. The floating gate's top surface may come down along at least two sides of the protrusion to a level below the top (110P-T) of the protrusion. The control gate's bottom surface may also comes down to a level below the top of the protrusion. The floating gate's bottom surface may comes down to a level below the top of the protrusion by at least 50% of the protrusion's height. The dielectric (120) separating the floating gate from the protrusion can be at least as thick at the top of the protrusion as at a level (L2) which is below the top of the protrusion by at least 50% of the protrusion's height. A very narrow fin or other narrow feature in memory and nonmemory integrated circuits can be formed by providing a first layer (320) and then forming spacers (330) from a second layer without photolithography on sidewalls of features made from the first layer. The narrow fin or other feature are then formed without further photolithography in areas between the adjacent spacers. More particularly, a third layer (340) is formed in these areas, and the first layer and the spacers are removed selectively to the third layer. The third layer is used as a mask to form the narrow features.

10 Claims, 4 Drawing Sheets

INTEGRATED CIRCUITS WITH SUBSTRATE PROTRUSIONS, INCLUDING (BUT NOT LIMITED TO) FLOATING GATE MEMORIES

BACKGROUND OF THE INVENTION

The present invention relates to integrated circuits having protrusions in a substrate. Examples of such integrated circuits include floating gate memories with substrate protrusions.

FIG. 1A is a perspective view of a conventional NAND memory with floating gates 102. FIG. 1B shows a vertical cross section of the memory along a plane DD' shown in FIG. 1A. Plane DD' passes through channel regions 104 and source/drain regions 106. Floating gates 102 are conductive elements made from doped polysilicon. Substrate isolation regions 108 ("field oxide" or FOX) are formed in P-type silicon substrate 110. Silicon dioxide 120 ("tunnel oxide") is formed on substrate 110 under the floating gates. ONO 130 (a sandwich of silicon oxide, silicon nitride, silicon oxide) insulates the floating gates from word lines (WL) 134. The word lines provide control gates used to control the floating gate voltages.

P-type channel regions 104 are portions of substrate 110 under the floating gates 102. Each channel region 104 is flanked by N-type source/drain regions 106 formed in substrate 110 on opposite sides of each floating gate 102. Each source/drain region 106 is shared by two adjacent memory cells in a string of memory cells connected in series, except for the source/drain regions 106 at the ends of the string.

The floating gates are programmed and erased via electron transfer between the floating gates and the substrate 110. The memory is read by sensing the current through a memory cell. NAND memory operation is described, for example, in U.S. Pat. No. 6,262,926 issued Jul. 17, 2001 to Nakai and incorporated herein by reference. See also U.S. Pat. No. 6,714,447 issued Mar. 30, 2004 to Satoh et al. and incorporated herein by reference.

In order to successfully scale the memory to low voltage operation, the current drive of the memory cells should be increased because the increased current would facilitate fast determination of the state of the cell. The current drive can be increased by reducing the thickness of tunnel oxide 120, but then data retention would be compromised as the charge leakage from the floating gates would increase. The current drive can also be increased by enlarging the memory cells, but this is also undesirable as smaller memories are in demand.

Therefore, there is a need for alternative memory structures and integrated circuit fabrication methods. There also seems to be always a demand for new fabrication methods capable to provide smaller features with a given photolithographic technology.

SUMMARY

This section summarizes some features of the invention. Other features are described in the subsequent sections. The invention is defined by the appended claims which are incorporated into this section by reference.

Some embodiments of the present invention provide memory and non-memory integrated circuits. In some non-volatile memories with floating gates, a memory cell's channel region is at least partially located in a fin-like protrusion of a semiconductor substrate. The floating gate is present on at least two sides of the protrusion. The control gate (the word line) can also be present on at least two sides of the protrusion. The channel width, and hence the current drive, can be increased by increasing the fin's height without increasing the cell's area. The increased current drive makes some embodiments particularly suitable for multi-level cell (MLC) implementations.

Fin-like protrusions have been used to increase the channel width of transistors (fin-FETs) which are not part of a non-volatile memory cell. Fin-FETs have also been used for charge-trapping NAND type memories with silicon nitride charge storage elements (rather than conductive charge storage elements, i.e. floating gates). See e.g. U.S. patent application Ser. No. 11/455,907, published as no. 2007/0018218 A1 on Jan. 25, 2007, incorporated herein by reference.

In some embodiments of the present invention, the floating gate's top surface comes down along at least two sides of the protrusion to a level below the top of the protrusion. In some embodiments, the control gate's bottom surface also comes down to a level below the top of the protrusion. The capacitive coupling can thus be increased between the floating and control gates, which is desirable if the memory is programmed and/or erased through the semiconductor substrate.

In some embodiments, the floating gate's bottom surface comes down to a level below the top of the protrusion by at least 50% of the protrusion's height.

In some embodiments, the dielectric separating the floating gate from the protrusion (e.g. tunnel oxide) is at least as thick at the top of the protrusion as at a level which is below the top of the protrusion by at least 50% of the protrusion's height.

Some embodiments of the present invention provide new techniques for making very narrow fins and other narrow features in memory and non-memory integrated circuits. In some embodiments, a first layer is provided, and then spacers are formed from a second layer without photolithography on sidewalls of features made from the first layer. The narrow features are formed without further photolithography in areas between the adjacent spacers. More particularly, a third layer is formed in these areas, and the first layer and the spacers are removed selectively to the third layer. The third layer is used as a mask to form the narrow features.

The invention is not limited to the features and advantages described above. Other features are described below. The invention is defined by the appended claims.

DESCRIPTION OF SOME EMBODIMENTS

The embodiments described in this section illustrate but do not limit the invention. In particular, the invention is not limited to specific materials, circuits, dimensions, or other features or advantages except as defined by the appended claims.

Figure 1A:
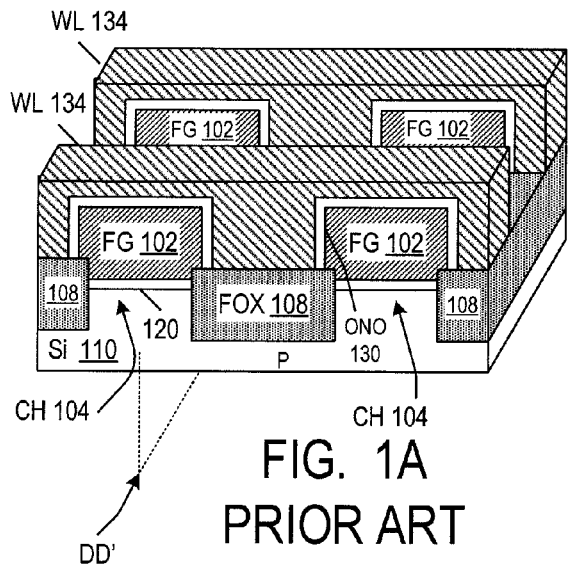
FIG. 1A is a perspective view of a prior art memory structure.
Figure 1B:
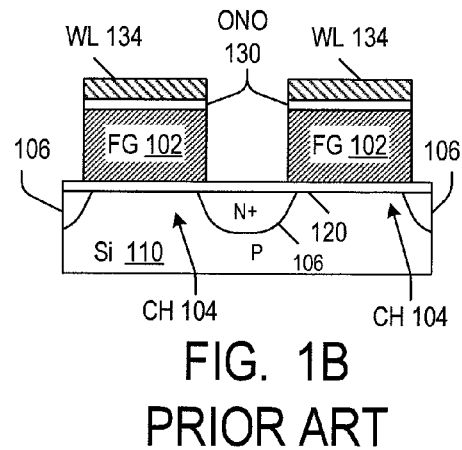
FIG. 1B shows a cross section of the memory of FIG. 1A.
Figure 2A:
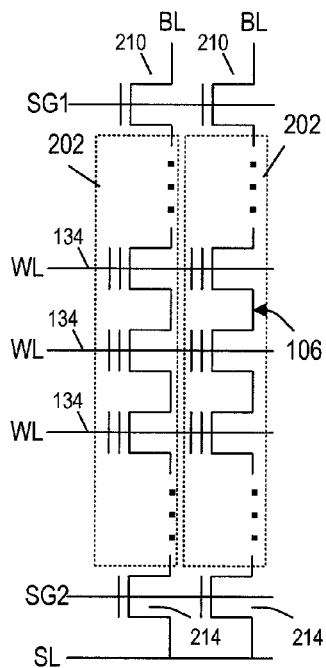
FIG. 2A is a circuit diagram of a memory according to some embodiments of the present invention.

Some embodiments of the invention will now be described on the example of a NAND floating gate memory whose circuit diagram is shown in FIG. 2A. The memory includes a number of strings 202 of serially connected memory cells. The cells of each string 202 are connected in series between a respective select transistor 210 and a respective select transistor 214. The gate of transistor 210 is connected to a respective line SG1. The gate of transistor 214 is connected to a respective line SG2. The source of transistor 214 is connected to a respective source line SL. One line SG1, one line SG2, and one source line SL are shared by a number of memory strings 202 which form a memory block. Each transistor 210 connects the corresponding memory string 202 to a corresponding bit line BL. A memory row corresponds to a word line WL interconnecting the control gates of memory cells in different strings 202 in the same block. Each bit line BL is connected to multiple blocks. See the aforementioned U.S. Pat. Nos. 6,262,926 and 6,714,447, incorporated herein by reference.

Figure 2B:
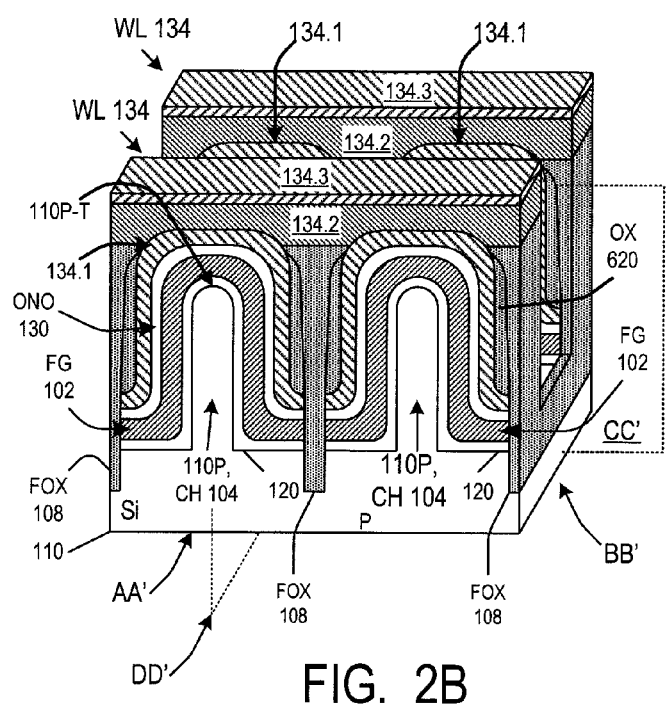
FIG. 2B is a perspective view of a memory according to some embodiments of the present invention.
Figure 2C:
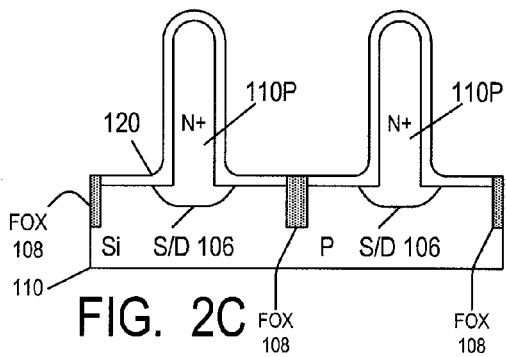
FIGS. 2C, 2D show vertical cross sections of the memory of FIG. 2A.
Figure 2D:
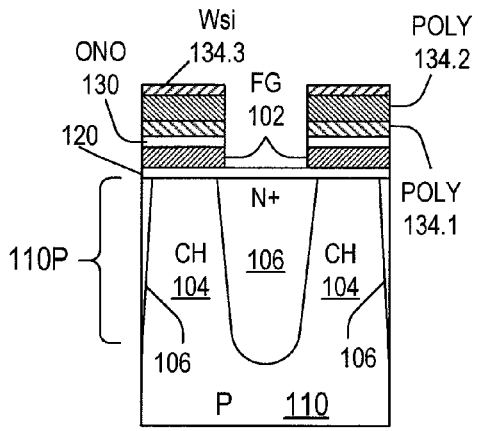

FIG. 2B is a perspective view of the memory. FIGS. 2C, 2D show planar vertical cross sections of the memory. The front plane in FIG. 2B is denoted AA'. This is a vertical plane passing through a word line WL. The right side plane is denoted BB'. This is a vertical plane perpendicular to the plane AA' and passing through a substrate isolation region 108 between adjacent strings 202 of a memory block. Substrate isolation regions 108 are sometimes referred to as "field oxide" or "FOX" even though regions 108 may contain non-oxide dielectric materials. Vertical plane CC' is parallel to AA', and passes between adjacent word lines WL of a memory block. The memory cross section by plane CC' is shown in FIG. 2C. Vertical plane DD' is parallel to BB', and passes through channel regions 104 and source/drain regions 106 of a string 202. The corresponding vertical cross section is shown in FIG. 2D.

Channel regions 104 are partially or entirely located in upward protrusions 110P of semiconductor substrate 110 (e.g. a monocrystalline silicon substrate). Each channel region 104 may also reach outside of the corresponding protrusion 110P along the horizontal surface of the substrate 110. Each protrusion 110P is a fin running through all the serially connected memory cells of a string 202 between the corresponding transistors 210, 214 (FIG. 2A). The transistors 210, 214 may or may not be formed as fin-FET transistors and may or may not share the fin 110P with the memory cells.

The memory cells' active areas of substrate 110, i.e. the areas containing the channel regions 104 and the source/drain regions 108, are covered with dielectric 120. Dielectric 120 will be referred to herein as "tunnel oxide" (TOX) because in the embodiment being described the dielectric 120 is silicon dioxide and the memory cells are erased and programmed via electron transfer through dielectric 120. The invention is not limited to silicon oxide or to the programming and erasing through dielectric 120 however. Floating gates 102 are conductive features made on tunnel oxide 120. Each floating gate 102 has portions on three sides (right, left, and top sides in FIG. 2B) of the corresponding fin 110P, and the channel 104 is also present at the three sides of the fin. (In some embodiments, the channel is present only on the left and right sides due to thicker dielectric 120 on top of the fin.) The channel width can therefore be increased merely by increasing the height of fins 110P.

Dielectric 130 (possibly but not necessarily ONO) covers the floating gates 102. Word lines 134 overlie the ONO 130. In the embodiment being described, the word lines 134 are made from polysilicon layers 134.1, 134.2 and a metal silicide (e.g. tungsten silicide) layer 134.3. Other materials can also be used.

Figure 3:
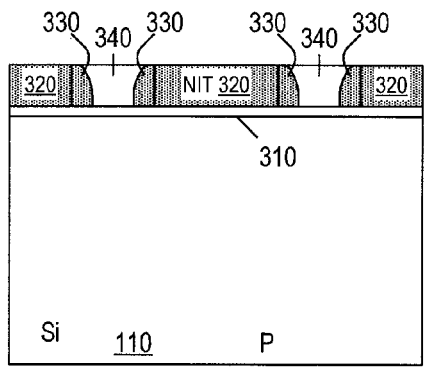
FIGS. 3-9 show vertical cross sections of the memory of FIG. 2A in the process of fabrication according to some embodiments of the present invention.

The memory fabrication is illustrated by cross sectional views along the plane AA' starting with FIG. 3. Once again, the materials and dimensions mentioned in this section are not limiting, and they are believed to be suitable for 50-nm node, but no representation is being made that verification in 50-nm technology has been performed.

The fabrication begins with forming very narrow fins 110P. A pad silicon oxide layer 310 (FIG. 3) is formed on a P-type monocrystalline silicon substrate 110, to an exemplary thickness of 5 nm. A layer 320, e.g. 100 nm thick silicon nitride, is deposited on oxide 310 and is patterned photolithographically to form strips extending perpendicularly to the AA' plane. The vertical cross sections by the AA' and CC' planes are identical at this point.

After removal of photoresist (not shown) used to pattern the nitride 320, a conformal layer 330 (e.g. silicon nitride) is deposited and blanket-etched anisotropically, without a mask over the memory blocks, to form spacers on sidewalls of nitride strips 320. The distance between the adjacent spacers defines the width of fins 110P, and can be well below the minimal photolithographic line width.

A layer 340 (e.g. amorphous carbon) is deposited over the structure to a level at or above the top surface of nitride 320. Layer 340 is polished (chemically and/or mechanically) and/or etched down (possibly selectively to layers 320, 330) at least until the nitride 320 is exposed.

Figure 4:
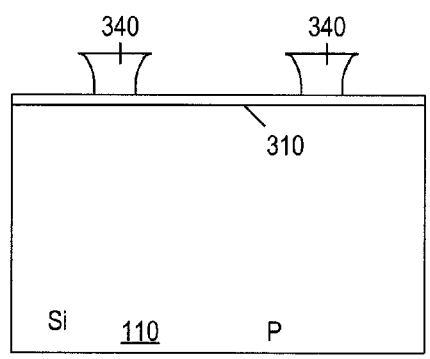

Nitride layers 320, 330 are etched away selectively to layer 340 (FIG. 4). Layer 340 forms a mask defining the fins 110P.

A short blanket oxide etch removes the pad oxide 310 between the mask strips 340. This etch can be selective to carbon 340.

Figure 5:
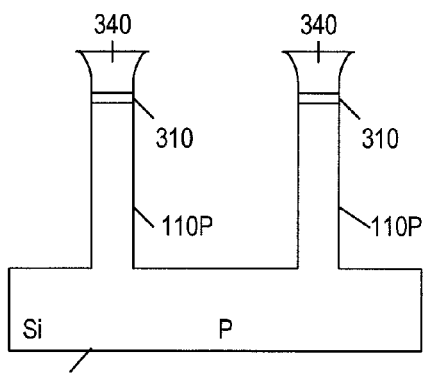

As shown in FIG. 5, a preferentially vertical silicon etch is conducted to form trenches in substrate 110. Fins 110P are protrusions formed between the trenches as a result of this etch. In some embodiments, the fins are about 100 nm tall and about 25 nm wide, and the trenches are 75 nm wide. Oxide 310 and carbon 340 are then removed.

Threshold voltage adjustment can be performed at this point if desired. For example, a silicon oxide liner (not shown) can be grown by thermal oxidation, and boron can be implanted through the liner at an angle to the substrate surface. Alternatively, the liner can be doped with boron (BSG), and the boron can be caused to diffuse into substrate 110 in a thermal process. A combination of boron diffusion and ion implantation through a BSG liner can also be used. These techniques are not limiting.

Figure 6:
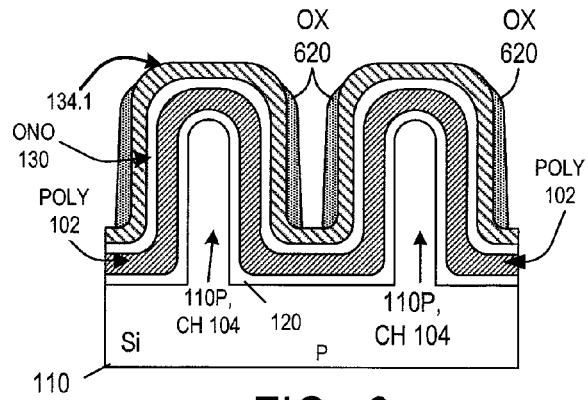

If a liner was deposited, it is stripped, and gate dielectric 120 (FIG. 6) is formed on substrate 110. In some embodiments, dielectric 120 is silicon dioxide grown by thermal oxidation to about 6 nm thickness. Then doped polysilicon 102 is deposited for the floating gates. A 20 nm thickness is believed to be suitable for this layer, and other thickness values (e.g. larger thickness values) are also believed to be suitable. ONO 130 is deposited on polysilicon 102, and conductive layer 134.1 is formed on the ONO. In some embodiments, layer 134.1 is doped polysilicon about 20 nm thick. Layer 134.1 is present on the right, left and top sides of each fin 110P, and is separated from polysilicon 102 only by the ONO on all the three sides.

Then spacers 620 are formed on sidewalls of layer 134.1 to provide a mask for substrate isolation regions 108. In some embodiments, the spacers are formed without photolithography over the memory blocks, via a conformal deposition and then anisotropic etch of silicon oxide or some other suitable material.

Photoresist 710 (FIG. 7) is deposited on the wafer and photolithographically patterned to form an additional mask over fins 110P. This edges of resist layer 710 are allowed to overlie the spacers 620, so precise positioning of the edges is not required.

Polysilicon 134.1 is removed in areas exposed by the masking layers 620, 710 selectively to oxide 620 and resist 710. Then ONO 130 is removed in these areas. Some but not all of oxide 620 can be etched in this step. Then polysilicon 102 is removed in these areas by an etch selective to silicon oxide. Then oxide 120 is removed in these areas. Some but not all of oxide 620 can be etched in this step. Finally, silicon substrate 110 is etched in these areas selectively to silicon oxide to form trenches for substrate isolation 108 (shallow trench isolation).

Figure 8:
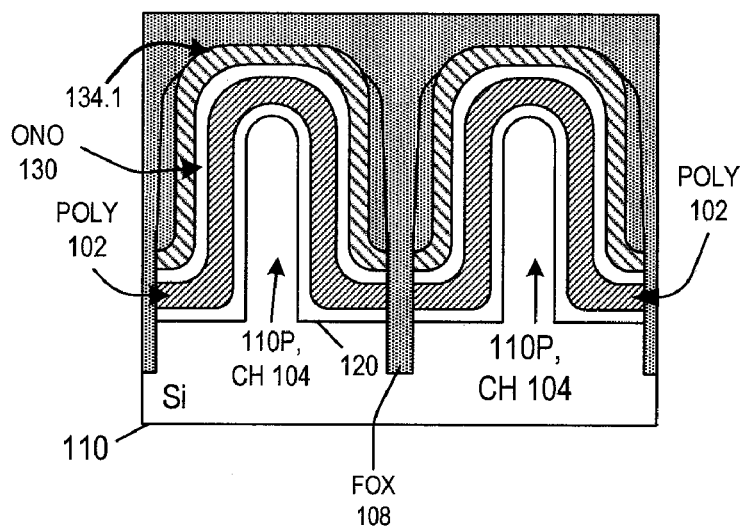
Figure 9:
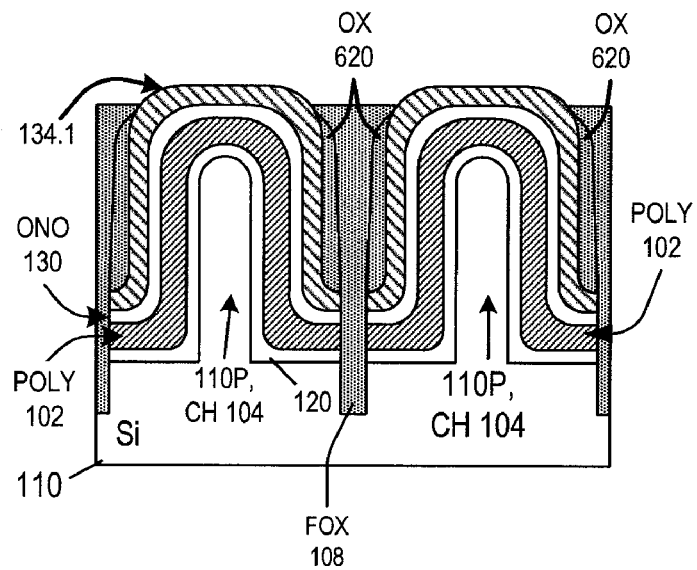

A channel stop implant of boron ions (B+) can be performed after forming the trenches. Then resist 710 is stripped, and silicon oxide 108 (FIG. 8) is deposited to cover the wafer and fill the substrate isolation trenches. Oxide 108 is etched down (or polished then etched) to expose polysilicon 134.1. This etch may continue after the exposure of polysilicon 134.1, and may expose and etch the oxide 620 (though this is not shown in the drawings).

Through this stage, cross sections AA', CC' were identical. All the vertical cross sections of a memory block by planes parallel to AA' have been identical up through this stage. Now the word lines are formed. The word lines can run perpendicularly to fins 110P, but this is not necessary. Conductive layers 134.2 (e.g. doped polysilicon), 134.3 (e.g. tungsten silicide) are deposited over the wafer. See FIGS. 2B, 2D. A mask ("word line mask", not shown) is formed photolithographically to define the word lines 134. Layers 134.3, 134.2, 134.1, 130, 102 are removed in areas exposed by the mask openings to form word lines 134 and floating gates 102. Some of dielectric 108 and 620 can be removed during the etch of ONO 130, and additional portions of dielectric 108, 620 can be removed before complete removal of polysilicon 134.1 between the word lines to facilitate the complete removal of polysilicon layers 134.1, 102 between the word lines. The word line mask can be stripped at this stage if desired. Suitable dopant (e.g. arsenic) is implanted, possibly at an angle, to form N+ source/drain regions 106 (FIGS. 2C, 2D).

Figure 7:
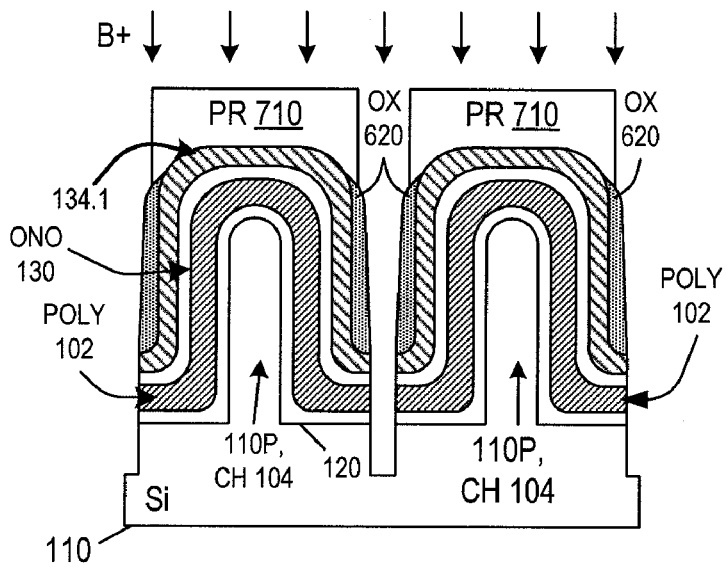

The memory fabrication can be completed using known techniques. Advantageously, much of the fabrication of the memory blocks is self-aligned. The only photolithographic steps needed for the memory blocks are the patterning of nitride 320 (FIG. 3) and photoresist 710 (FIG. 7). The photoresist patterning is tolerant to misalignment due to oxide 620 is explained above. The invention is not limited to such embodiments however. Also, photolithography may be needed for peripheral circuitry (not shown).

Figure 10:
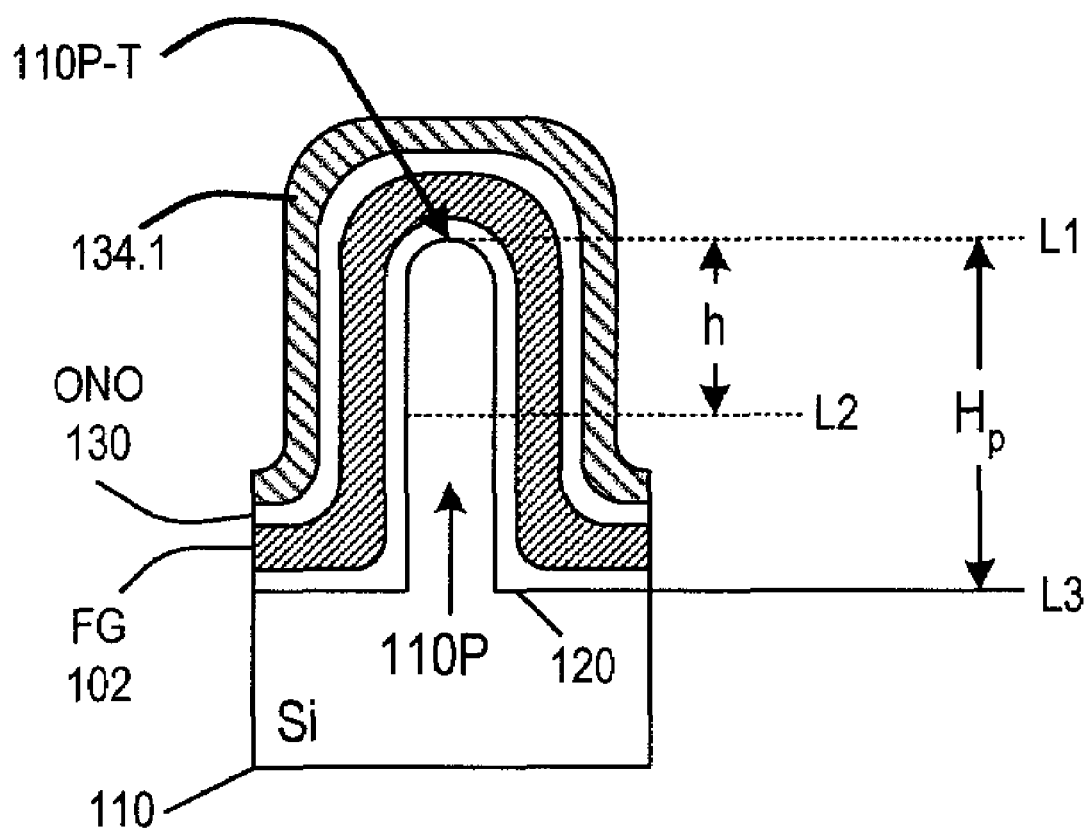
FIG. 10 marks some features obtained in some embodiments of FIG. 2A.

Thus, some embodiments of the present invention include an integrated circuit comprising a nonvolatile memory cell comprising: a semiconductor substrate having an upward protrusion (e.g. 110P); a first dielectric feature (e.g. oxide 120, or the portion of oxide 120 underneath a floating gate 102) present at least on the protrusion's sidewalls on at least two sides of the protrusion; and a floating gate present at least over said sidewalls on at least said two sides of the protrusion and separated from the protrusion by the first dielectric feature, the floating gate having a top surface coming down along the at least two sides of the protrusion to a level below a top of the protrusion. See FIG. 10, showing some features of the cross section AA'. The top of a protrusion 110P is marked as 110P-T, and is at a level L1. The top surface (the outer surface) of floating gate 102 comes down on both sides of the protrusion 110P to a level below the top 110P-T (below L1).

In some embodiments, the nonvolatile memory cell further comprises: a second dielectric feature (e.g. ONO 130) over the floating gate; and a conductive gate (e.g. 134.1, or a combination of 134.1, 134.2, 134.3) over the second dielectric feature, the conductive gate having a bottom surface coming down along at least the two sides of the protrusion to a level below the top of the protrusion. For example, in FIG. 10, the bottom surface of layer 134.1 comes down to a level below the protrusion top 110P-T.

In some embodiments, the memory cell is one of a first plurality of nonvolatile memory cells in the integrated circuit (e.g. one of a string 202 in FIG. 2A).

In some embodiments, the protrusion is one of a plurality of protrusions of the semiconductor substrate; the first plurality of nonvolatile memory cells is one of a plurality of first pluralities of nonvolatile memory cells (e.g., the plurality of first pluralities can be a memory block containing a plurality of strings 202).

Some embodiments include a substrate isolation region (e.g. 108) between two of the protrusions, the substrate isolation region being a dielectric region whose bottom surface is lower than a bottom of the two adjacent protrusions.

Some embodiments include a plurality of conductive lines (e.g. word lines 134) each of which provides a conductive gate to each of a plurality of the memory cells associated with different protrusions.

In some embodiments, each conductive gate is present on at least the two sides of the associated protrusion over the respective floating gate (e.g. each word line 134 includes a feature 134.1 present on two sides of the associated protrusion).

Some embodiments include an integrated circuit comprising a nonvolatile memory cell comprising: a semiconductor substrate having an upward protrusion; a first dielectric feature (e.g. 120) present at least on the protrusion's sidewalls on at least two sides of the protrusion; a floating gate present at least over said sidewalls on at least said two sides of the protrusion and separated from the protrusion by the first dielectric feature; a second dielectric feature (e.g. ONO 130) over the floating gate; and a conductive gate (e.g. 134) over the second dielectric feature, the conductive gate having a bottom surface coming down along at least the two sides of the protrusion to a level below a top of the protrusion.

In some embodiments, the protrusion is one of a plurality of protrusions of the semiconductor substrate; the nonvolatile memory cell is one of a plurality of nonvolatile memory cells in the integrated circuit (e.g. a row of memory cells), each memory cell being associated with a respective one of said protrusions; wherein the integrated circuit further comprises a conductive line (e.g. word line 134) interconnecting the conductive gates and having a planar top surface lying above the tops of the protrusions.

Some embodiments include an integrated circuit comprising a nonvolatile memory cell comprising: a semiconductor substrate having an upward protrusion; a first dielectric feature present at least on the protrusion's sidewalls on at least two sides of the protrusion; and a floating gate present at least over said sidewalls on at least said two sides of the protrusion and separated from the protrusion by the first dielectric feature, the floating gate having a bottom surface coming down along the at least two sides of the protrusion to a level which is below a top of the protrusion by at least 50% of a height of the protrusion. For example, in some embodiments of FIG. 10, the height $H_p$ of each protrusion 110P is 100 nm ($H_p$ is the distance between the levels L1 and L3, where L3 is the bottom protrusion 110P). Oxide 120 is 6 nm thick, so the bottom point of floating gate 102 is only 6 nm above the bottom of protrusion 110P, i.e. 94 nm below the top 110P-T of protrusion 110P. Therefore, the bottom surface of floating gate 102 comes down to a level which is below the top 110P-T by 94 nm, i.e. more than 50% of the 100 nm height of the protrusion. The level 50% below the top of the protrusion is marked L2. The distance between L1 and L2 is shown as h, and $h/H_p=50\%$. The bottom surface of floating gate 102 comes down to a level below h.

In some embodiments, the bottom surface of the floating gate comes down to a level below the top of the protrusion by at least 90% of the height of the protrusion.

Some embodiments include an integrated circuit comprising a nonvolatile memory cell comprising: a semiconductor substrate having an upward protrusion; a first dielectric feature present at least on the protrusion's sidewalls on at least two sides of the protrusion and coming down along the at least two sides of the protrusion, wherein the first dielectric feature at least as thick at a top of the protrusion as at a level which is below the top of the protrusion by at least 50% of the height of the protrusion. (For example, in some embodiments of FIG. 10, oxide 120 is at least as thick at the top of the protrusion 110P as at the level L2 half way between the top and the bottom of the protrusion.) The floating gate is separated from the protrusion by the first dielectric feature, the floating gate having a bottom surface coming down along the at least two sides of the protrusion and physically contacting the first dielectric feature at least at said level (e.g. at the level L2).

Some embodiments provide a method for fabricating an integrated circuit comprising a nonvolatile memory comprising a plurality of conductive floating gates, the method comprising: forming a plurality of elongated semiconductor protrusions protruding upward from a semiconductor substrate; forming a first plurality of dielectric features (e.g. 120) over the one or more protrusions, each dielectric feature being present over at least two sides of one of the protrusions; forming a first layer (e.g. floating gate polysilicon 102) over the dielectric features, the first layer being present over at least two sides of each protrusion, the first layer providing at least a portion of each of the floating gates; forming spacers (e.g. 620) over sidewalls of the protrusions over the first layer; and forming at least one substrate isolation region between the adjacent spacers using the spacers as a mask.

Some embodiments further comprise removing portions of the first layer which are not covered by the spacers using the spacers as a mask. See FIG. 7 for example.

Some embodiments include implanting a dopant (e.g. channel stop) into the substrate using the spacers as a mask.

Some embodiments further include photolithographically forming a first mask (e.g. photoresist 710) having edges over the spacers; wherein both the first mask and the spacers are used as a mask in forming the at least one substrate isolation region.

Some embodiments further include: forming a first dielectric (e.g. ONO 130) over the first layer; forming a conductive layer (e.g. 134.1, 134.2, 134.3) and etching the conductive layer, the first dielectric and the first layer to define the floating gates and also to form conductive gates from the conductive layer for the nonvolatile memory.

Some embodiments include a method for fabricating an integrated circuit comprising one or more protrusions in a substrate. The integrated circuit may or may not comprise a memory. The method comprises: forming a first layer (e.g. nitride 320 in FIG. 3) over a first area (e.g. a block) of the substrate, the first layer comprising a plurality of first features over the first area. For example, each feature can be a strip of nitride 320 over the memory block or a number of blocks. The strips may be interconnected outside the first area. The method further comprises forming a second layer (e.g. nitride 330) over the first layer and the substrate, the second layer covering the first area; performing a preferentially vertical etch of the second layer over the first area without a mask over the first area to form spacers over sidewalls of the first features; providing a third layer (e.g. 340) between adjacent spacers over the first area; exposing a portion of the substrate, the exposing operation comprising etching the first layer and the spacers selectively to the third layer; and etching the portion of the substrate to form one or more trenches in the substrate in the first area and to form said one or more protrusions between the trenches. See e.g. FIG. 5.

In some embodiments, in at least one vertical cross section (e.g. AA') at least one of said protrusions has a width below a minimal photolithographic line width.

In some embodiments, in said vertical cross section a distance between the adjacent first features (e.g. between the adjacent nitride strips 320) is about equal to a minimal photolithographic line width.

In some embodiments, in at least said vertical cross section at least one of said protrusions has a width equal to or less than 50% of a width of each first feature. For example, in FIG. 5, the width of a protrusion 110P can be at most 50% of the width of a nitride strip 320. The protrusion width is measured half way down the protrusion in some embodiments.

The invention is not limited to the embodiments described above. For example, the protrusions 110P can meet outside of a memory block and thus can be part of a single continuous protrusion. The floating gate memories according to some embodiments of the invention include memories other than NAND. Other embodiments and variations are within the scope of the invention, as defined by the appended claims.

The invention claimed is:

1. A method for fabricating an integrated circuit comprising a nonvolatile memory comprising a plurality of conductive floating gates, the method comprising:

forming a plurality of elongated semiconductor protrusions protruding upward from a semiconductor substrate;

forming a first plurality of dielectric features over the one or more protrusions, each dielectric feature being present over at least two sides of one of the protrusions;

forming a first layer over the dielectric features, the first layer being present over at least two sides of each protrusion, the first layer providing at least a portion of each of the floating gates;

forming spacers over sidewalls of the protrusions over the first layer; and forming at least one substrate isolation region between the adjacent spacers using the spacers as a mask.

2. The method of claim 1 further comprising removing portions of the first layer which are not covered by the spacers using the spacers as a mask.

3. The method of claim 2 wherein forming at least one substrate isolation region comprises:

etching the semiconductor substrate using the spacers as a mask to form at least one trench in the semiconductor substrate; and forming dielectric in the at least one trench.

4. The method of claim 2 wherein forming at least one substrate isolation region comprises implanting a dopant into the substrate using the spacers as a mask.

5. The method of claim 2 further comprising photolithographically forming a first mask having edges over the spacers;
   wherein both the first mask and the spacers are used as a mask in forming the at least one substrate isolation region.

6. The method of claim 2 further comprising:
   forming a first dielectric over the first layer;
   forming a conductive layer and etching the conductive layer, the first dielectric and the first layer to define the floating gates and also to form conductive gates from the conductive layer for the nonvolatile memory.

7. A method for fabricating an integrated circuit comprising one or more protrusions in a substrate, the method comprising:
   forming a first layer over a first area of the substrate, the first layer comprising a plurality of first features over the first area;
   forming a second layer over the first layer and the substrate, the second layer covering the first area;
   performing a preferentially vertical etch of the second layer over the first area without a mask over the first area to form spacers over sidewalls of the first features;
   providing a third layer between adjacent spacers over the first area;
   exposing a portion of the substrate, the exposing operation comprising etching the first layer and the spacers selectively to the third layer; and
   etching the portion of the substrate to form one or more trenches in the substrate in the first area and to form said one or more protrusions between the trenches.

8. The method of claim 7 wherein in at least one vertical cross section at least one of said protrusions has a width below a minimal photolithographic line width.

9. The method of claim 7 wherein in said vertical cross section a distance between the adjacent first features is about equal to a minimal photolithographic line width.

10. The method of claim 7 wherein in at least said vertical cross section at least one of said protrusions has a width equal to or less than 50% of a width of each first feature.

* * * * *